(12) United States Patent
Wang et al.

(10) Patent No.: US 11,380,857 B2
(45) Date of Patent: Jul. 5, 2022

(54) STRETCHABLE DISPLAY PANEL, METHOD OF FABRICATING STRETCHABLE DISPLAY PANEL, AND DISPLAY APPARATUS

(71) Applicant: BOE Technology Group Co., Ltd., Beijing (CN)

(72) Inventors: Pinfan Wang, Beijing (CN); Fangxu Cao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 142 days.

(21) Appl. No.: 16/765,699

(22) PCT Filed: Oct. 16, 2019

(86) PCT No.: PCT/CN2019/111459
§ 371 (c)(1),
(2) Date: May 20, 2020

(87) PCT Pub. No.: WO2021/000453
PCT Pub. Date: Jan. 7, 2021

(65) Prior Publication Data
US 2021/0408409 A1    Dec. 30, 2021

(30) Foreign Application Priority Data
Jul. 2, 2019    (CN) .......................... 201910596750.2

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3276* (2013.01); *H01L 51/003* (2013.01);
(Continued)

(58) Field of Classification Search
None
See application file for complete search history.

(56) References Cited

U.S. PATENT DOCUMENTS

| 8,912,094 | B2 | 12/2014 | Koo et al. |
| 9,756,723 | B2 | 9/2017 | Hong et al. |

(Continued)

FOREIGN PATENT DOCUMENTS

| CN | 105895662 A | 8/2016 |
| CN | 107221549 A | 9/2017 |

(Continued)

OTHER PUBLICATIONS

Machine translation of KR-10-20200040084 (Year: 2018).*
(Continued)

*Primary Examiner* — J. E. Schoenholtz
(74) *Attorney, Agent, or Firm* — Intellectual Valley Law, P.C.

(57) ABSTRACT

A stretchable display panel is provided. The stretchable display panel includes a stretchable base substrate; a plurality of islands and a plurality of bridges on the stretchable base substrate; a plurality of display elements respectively on sides of the plurality of islands away from the stretchable base substrate; and a plurality of signal lines respectively on sides of the plurality of bridges away from the stretchable base substrate. The plurality of bridges include a plurality of row bridges arranged in a row direction and a plurality of column bridges arranged in a column direction. Two directly adjacent islands in a same row of islands are connected by a respective one of the plurality of row bridges. Two directly adjacent islands in a same column of islands are connected by a respective one of the plurality of column bridges.

18 Claims, 6 Drawing Sheets

(52) U.S. Cl.
CPC ........ *H01L 51/56* (2013.01); *H01L 2227/326* (2013.01); *H01L 2251/5338* (2013.01)

(56) References Cited

U.S. PATENT DOCUMENTS

| | | | |
|---|---|---|---|
| 2016/0049602 A1 | 2/2016 | Kim | |
| 2016/0240802 A1 | 8/2016 | Lee | |
| 2017/0110531 A1 | 4/2017 | Ko et al. | |
| 2017/0278920 A1 | 9/2017 | Park et al. | |
| 2017/0279057 A1 | 9/2017 | Park et al. | |
| 2018/0046221 A1* | 2/2018 | Choi | G02B 26/0825 |
| 2019/0189639 A1 | 6/2019 | Zuo et al. | |
| 2020/0184856 A1 | 6/2020 | Wang et al. | |

FOREIGN PATENT DOCUMENTS

| | | |
|---|---|---|
| CN | 107564415 A | 1/2018 |
| CN | 107731866 A | 2/2018 |
| CN | 107994036 A | 5/2018 |
| CN | 108269501 A | 7/2018 |
| CN | 108649054 A | 10/2018 |
| CN | 108766951 A | 11/2018 |
| CN | 108847134 A | 11/2018 |
| CN | 108898953 A | 11/2018 |
| CN | 109427248 A | 3/2019 |
| CN | 109524441 A | 3/2019 |
| CN | 109791747 A | 5/2019 |
| CN | 109872631 A | 6/2019 |
| JP | 2018200355 A | 12/2018 |
| KR | 20200040084 A * | 4/2020 |

OTHER PUBLICATIONS

International Search Report & Written Opinion dated Apr. 1, 2020, regarding PCT/CN2019/111459.
First Office Action in the Chinese Patent Application No. 201910596750.2, dated Mar. 9, 2020; English translation attached.

* cited by examiner

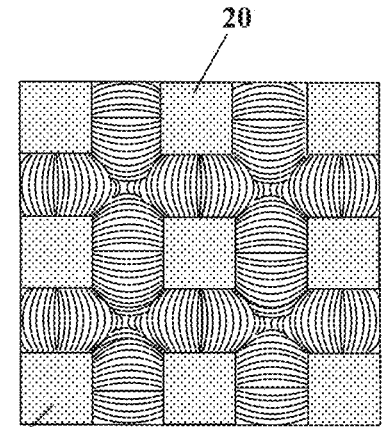

FIG. 7

| Forming a supporting structure comprising a plurality of islands and a plurality of bridges on a support substrate |
|---|
| Forming a plurality of display elements respectively on sides of the plurality of islands away from the stretchable base substrate |
| Forming a plurality of signal lines respectively on sides of the plurality of bridges away from the stretchable base substrate |
| Removing the support substrate from the supporting structure |
| Applying a force on a stretchable base substrate to stretch the stretchable base substrate |
| Disposing the supporting structure on the stretchable base substrate having the force applied thereon |
| Removing the force applied on the stretchable base substrate to form at least a portion of the stretchable base substrate in regions corresponding to the plurality of bridges buckled when substantially unstretched |

FIG.8

Forming a plurality of first supports on the support substrate, including:

forming a first support material layer on the support substrate; and
patterning the first support material layer to form a plurality of first supports on the support substrate Forming the plurality of second supports, including:
forming a second support material layer on sides of the plurality of first supports away from the plurality of first supports

FIG. 9

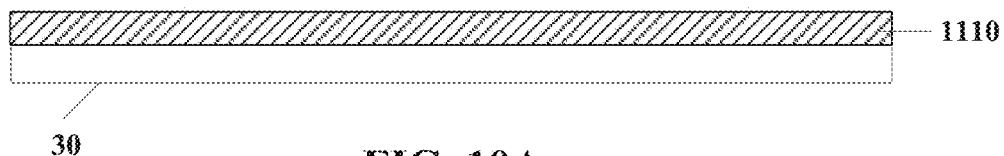

FIG. 10A

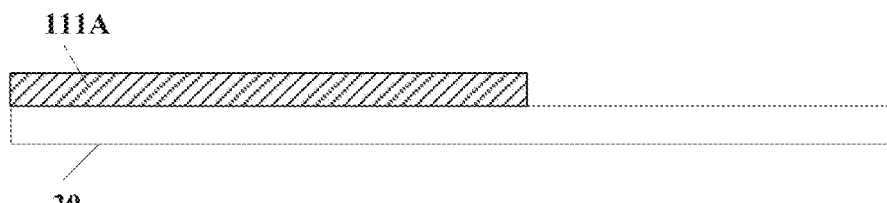

FIG. 10B

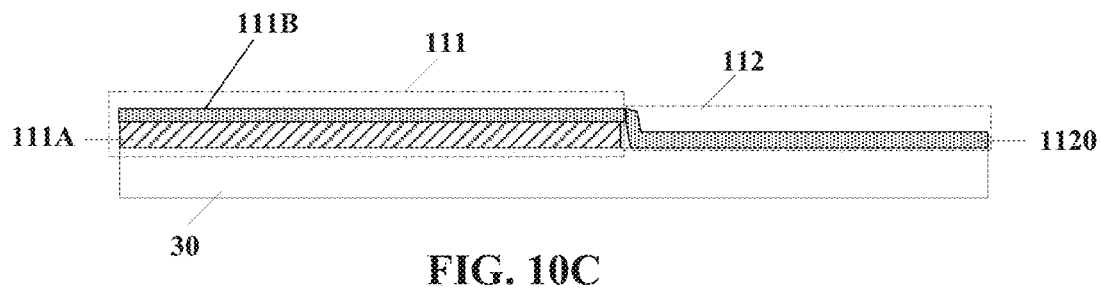

FIG. 10C

STRETCHABLE DISPLAY PANEL, METHOD OF FABRICATING STRETCHABLE DISPLAY PANEL, AND DISPLAY APPARATUS

CROSS-REFERENCE TO RELATED APPLICATION

This application is a national stage application under 35 U.S.C. § 371 of International Application No. PCT/CN2019/111459, filed Oct. 16, 2019, which claims priority to Chinese Patent Application No. 201910596750.2, filed Jul. 2, 2019. Each of the forgoing applications is herein incorporated by reference in its entirety for all purposes.

TECHNICAL FIELD

The present invention relates to display technology, more particularly, to a stretchable display panel, a method of fabricating a stretchable display panel, and a display apparatus.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allow its length to be increased in one or more dimensions. Stretchable electronic apparatuses may be useful in various applications including in display apparatuses and sensor arrays.

SUMMARY

In one aspect, the present invention provides a stretchable display panel, comprising a stretchable base substrate; a supporting structure comprising a plurality of islands and a plurality of bridges on the stretchable base substrate; a plurality of display elements respectively on sides of the plurality of islands away from the stretchable base substrate; and a plurality of signal lines respectively on sides of the plurality of bridges away from the stretchable base substrate, a respective one of the plurality of signal lines connecting two adjacent display elements; wherein the plurality of islands are arranged in a form of an array; the plurality of bridges comprise a plurality of row bridges arranged in a row direction and a plurality of column bridges arranged in a column direction; two directly adjacent islands in a same row of islands are connected by a respective one of the plurality of row bridges; two directly adjacent islands in a same column of islands are connected by a respective one of the plurality of column bridges; at least a portion of a respective one of the plurality of bridges is buckled when substantially unstretched; at least a portion of the stretchable base substrate in a region corresponding to the respective one of the plurality of bridges is buckled when substantially unstretched; and regions of the stretchable display panel corresponding to the plurality of islands have a Young's Modulus greater than a Young's Modulus of regions of the stretchable display panel corresponding to the plurality of bridges.

Optionally, the respective one of the plurality of row bridges between the two directly adjacent islands in the same row of islands has a length along the column direction equal to or greater than a length along the column direction of each of the two directly adjacent islands in the same row of islands.

Optionally, the respective one of the plurality of column bridges between the two directly adjacent islands in the same column of islands has a width along the row direction equal to or greater than a width along the row direction of each of the two directly adjacent islands in the same column of islands.

Optionally, the plurality of islands comprise a plurality of first supports on the stretchable base substrate, and a plurality of second supports respectively on sides of the plurality of first supports away from the stretchable base substrate; thicknesses of the plurality of first supports are greater than thicknesses of the plurality of second supports; the plurality of second supports and the plurality of bridges forms a unitary structure; and the thicknesses of the plurality of second supports and thicknesses of the plurality of bridges are substantially the same.

Optionally, the plurality of second supports and the plurality of bridges together form a continuous layer extending throughout an entirety of a display area of the stretchable display panel.

Optionally, the stretchable display panel has a plurality of first regions, a respective one of the plurality of first regions between two adjacent rows of a plurality of rows of islands; a plurality of second regions, a respective one of the plurality of second regions between two adjacent columns of a plurality of columns of islands, the plurality of first regions and the plurality of second regions intersecting with each other forming a plurality of intersection regions; and a plurality of gap regions in which the supporting structure is at least partially absent, a respective one of the plurality of gap regions at least partially in the respective one of the plurality of intersection regions.

Optionally, the respective one of the plurality of gap regions is limited in the respective one of the plurality of intersection regions.

Optionally, the regions of the stretchable display panel corresponding to the plurality of bridges have the Young's Modulus greater than a Young's Modulus of regions of the stretchable display panel corresponding to the plurality of gap regions.

Optionally, the respective one of the plurality of gap regions abuts two adjacent row bridges of the plurality of row bridges, and abuts two adjacent column bridges of the plurality of column bridges.

Optionally, the respective one of the plurality of gap regions is spaced apart from adjacent islands of the plurality of islands by the two adjacent row bridges and the two adjacent column bridges; and an entirety of a periphery of a respective one of the plurality of islands is surrounded by adjacent bridges of the plurality of bridges.

Optionally, a plurality of columns of islands and a plurality of columns of column bridges are alternatively arranged; and a plurality of rows of islands and a plurality of rows of row bridges are alternatively arranged.

Optionally, the plurality of first supports comprise an organic insulating material; and the plurality of second supports and the plurality of bridges comprise an inorganic insulating material.

Optionally, the plurality of display elements respectively comprises a plurality of organic light emitting diodes; and a plurality of thin film transistors respectively connected to the plurality of organic light emitting diodes.

In another aspect, the present invention provides a method of fabricating a stretchable display panel, comprising forming a supporting structure comprising a plurality of islands and a plurality of bridges on a support substrate; forming a plurality of display elements respectively on sides of the plurality of islands away from the support substrate; forming a plurality of signal lines respectively on sides of the plurality of bridges away from the support substrate, a respective one of the plurality of signal lines connecting two adjacent display elements; removing the support substrate from the supporting structure; applying a force on a stretchable base substrate to stretch the stretchable base substrate; disposing the supporting structure on the stretchable base substrate having the force applied thereon; and removing the force applied on the stretchable base substrate to form at least a portion of the stretchable base substrate in a region corresponding to a respective one of the plurality of bridges which is buckled when substantially unstretched; wherein the plurality of islands are arranged in a form of an array; the plurality of bridges are formed to comprises a plurality of row bridges arranged along a row direction; and a plurality of column bridges arranged along a column direction; two directly adjacent islands in a same row of islands are connected by a respective one of the plurality of row bridges; and two directly adjacent islands in a same column of islands are connected by a respective one of the plurality of column bridges.

Optionally, forming the supporting structure on a support substrate comprises forming a plurality of first supports on the support substrate; and forming a plurality of second supports respectively on sides of the plurality of first supports away from the support substrate; wherein forming the plurality of first supports comprises forming a first support material layer on the support substrate; and patterning the first support material layer to form a plurality of first supports on the support substrate; wherein forming the plurality of second supports comprises forming a second support material layer on sides of the plurality of first supports away from the support substrate; wherein a respective one of the plurality of islands are formed by forming the respective one of the plurality of first supports, and forming the respective one of the plurality of second supports.

Optionally, the second support material layer is formed to extend throughout an entirety of the support substrate; wherein the plurality of second supports are portions of the second support material layer in regions corresponding to the plurality of first supports; a portion of the second support material layer in regions between two directly adjacent islands in a same row of islands forms a respective one of the plurality of row bridges; and a portion of the second support material layer in regions between two directly adjacent islands in a same column of islands forms a respective one of the plurality of column bridges.

Optionally, the plurality of first supports have a pattern that defines a plurality of first regions and a plurality of second regions; a respective one of the plurality of first regions is between two adjacent rows of a plurality of rows of first supports; a respective one of the plurality of second regions is between two adjacent columns of a plurality of columns of first supports; the plurality of first regions and the plurality of second regions intersect with each other to form a plurality of intersection regions; wherein forming the supporting structure further comprises etching the second support material layer in a plurality of gap regions, in which the second support material layer is at least partially absent; and a respective one of the plurality of gap regions is at least partially in the respective one of the plurality of intersection regions.

Optionally, the plurality of first supports are formed using an organic insulating material; and the plurality of second supports and the plurality of bridges are formed using an inorganic insulating material.

Optionally, forming the plurality of display elements comprises forming a plurality of organic light emitting diodes respectively in regions corresponding to the plurality of display elements; and forming a plurality of thin film transistors respectively connected to the plurality of organic light emitting diodes.

Optionally, the respective one of the plurality of row bridges between the two directly adjacent islands in the same row of islands is formed to have a length along the column direction equal to or greater than a length along the column direction of each of the two directly adjacent islands in the same row of islands.

Optionally, the respective one of the plurality of column bridges between the two directly adjacent islands in the same column of islands is formed to have a width along the row direction equal to or greater than a width along the row direction of each of the two directly adjacent islands in the same column of islands.

Optionally, regions of the stretchable display panel corresponding to the plurality of islands are formed to have a Young's Modulus greater than a Young's Modulus of regions of the stretchable display panel corresponding to the plurality of bridges; and the regions of the stretchable display panel corresponding to the plurality of bridges are formed to have the Young's Modulus greater than a Young's Modulus of regions of the stretchable display panel corresponding to the plurality of gap regions.

In another aspect, the present invention provides a display apparatus, comprising the stretchable display panel described herein or fabricated by a method described herein; and one or more integrated circuits connected to the stretchable display panel.

BRIEF DESCRIPTION OF THE FIGURES

The following drawings are merely examples for illustrative purposes according to various disclosed embodiments and are not intended to limit the scope of the present invention.

FIG. 7 is a schematic diagram illustrating buckled portions of a stretchable base substrate in some embodiments according to the present disclosure.

FIG. 8 is a flow chart illustrating a method of fabricating a stretchable display panel in some embodiments according to the present disclosure.

FIG. 9 is a flow chart illustrating a method of forming a supporting structure in some embodiments according to the present disclosure.

FIG. 104 to FIG. 10G are schematic diagrams illustrating a process of fabricating a stretchable display panel in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter aha, a stretchable display panel, a method of fabricating a stretchable display panel, and a display apparatus that substantially obviate one or more of the problems due to limitations and disadvantages of the related art. In one aspect, the present disclosure provides a stretchable display panel. In some embodiments, the stretchable display panel includes a stretchable base substrate; and a supporting structure including a plurality of islands and a plurality of bridges on the stretchable base substrate; a plurality of display elements respectively on sides of the plurality of islands away from the stretchable base substrate; and a plurality of signal lines respectively on sides of the plurality of bridges away from the stretchable base substrate, a respective one of the plurality of signal lines connecting two adjacent display elements. Optionally, the plurality of islands are arranged in a form of an array. Optionally, the plurality of bridges includes a plurality of row bridges arranged in a row direction and a plurality of column bridges arranged in a column direction. Optionally, two directly adjacent islands in a same row of islands are connected by a respective one of the plurality of row bridges. Optionally, two directly adjacent islands in a same column of islands are connected by a respective one of the plurality of column bridges. Optionally, at least a portion of a respective one of the plurality of bridges is buckled when substantially unstretched. Optionally, at least a portion of the stretchable base substrate in a region corresponding to the respective one of the plurality of bridges is buckled when substantially unstretched. Optionally, regions of the stretchable display panel corresponding to the plurality of islands have a Young's Modulus greater than a Young's Modulus of regions of the stretchable display panel corresponding to the plurality of bridges.

Figure 1:
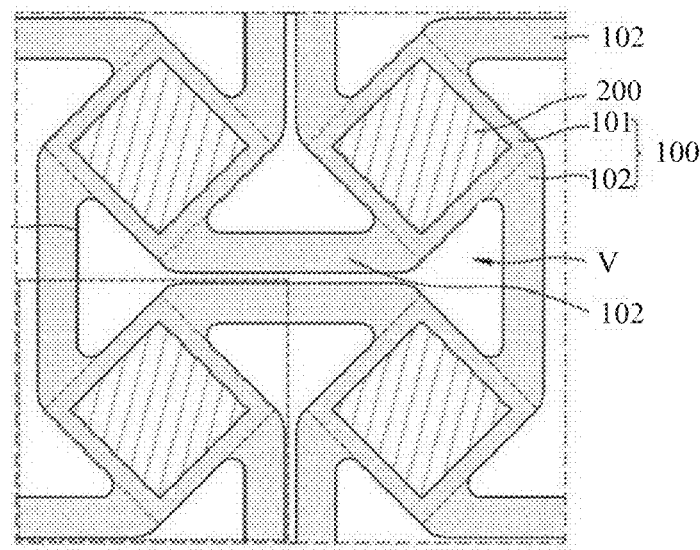
FIG. 1 is a schematic diagram of a structure of a related stretchable display panel.

FIG. 1 is a schematic diagram of a structure of a related stretchable display panel. Referring to FIG. 1, a related stretchable display panel includes a base substrate 100, a plurality of display units 200 on the base substrate 100. Optionally, the base substrate 100 includes a plurality of island portions 101, and any adjacent island portions of the plurality of island portions 101 are spaced apart from each other. Optionally, the base substrate 100 further includes a plurality of bridge portions 102. Two adjacent island portions of the plurality of island portions 101 are connected with each other by a respective one of the plurality of bridge portions 102. Optionally, the related stretchable display panel further includes a plurality vias V extending through the base substrate 100. A respective one of the plurality of vias V are surrounded by a respective one of the plurality of bridge portions 102 and two adjacent island portions of the plurality of island portions 101. Optionally, the plurality of display units 200 are respectively disposed on the plurality of island portions 101.

A large portion of the related stretchable display panel is occupied by the plurality of vias, so the remaining portion of the related stretchable display panel used to accommodate the plurality of island portions are limited. Moreover, an encapsulating layer of the related stretchable display panel is in direct contact with edges of the plurality of island portions to encapsulate the plurality of display units into a plurality of independent units. An encapsulating area on a surface of the respective one of the plurality of islands and abutting the edge of the respective one of the plurality of islands is an area where the encapsulating layer and the respective one of the plurality of islands are in direction contact with each other, so that the encapsulating area will not be covered by a respective one of the plurality of display units, which may result in a relatively small room for accommodating the respective one of the plurality of the display units, and the resolution of the related stretchable display panel may be decreases.

Figure 2:
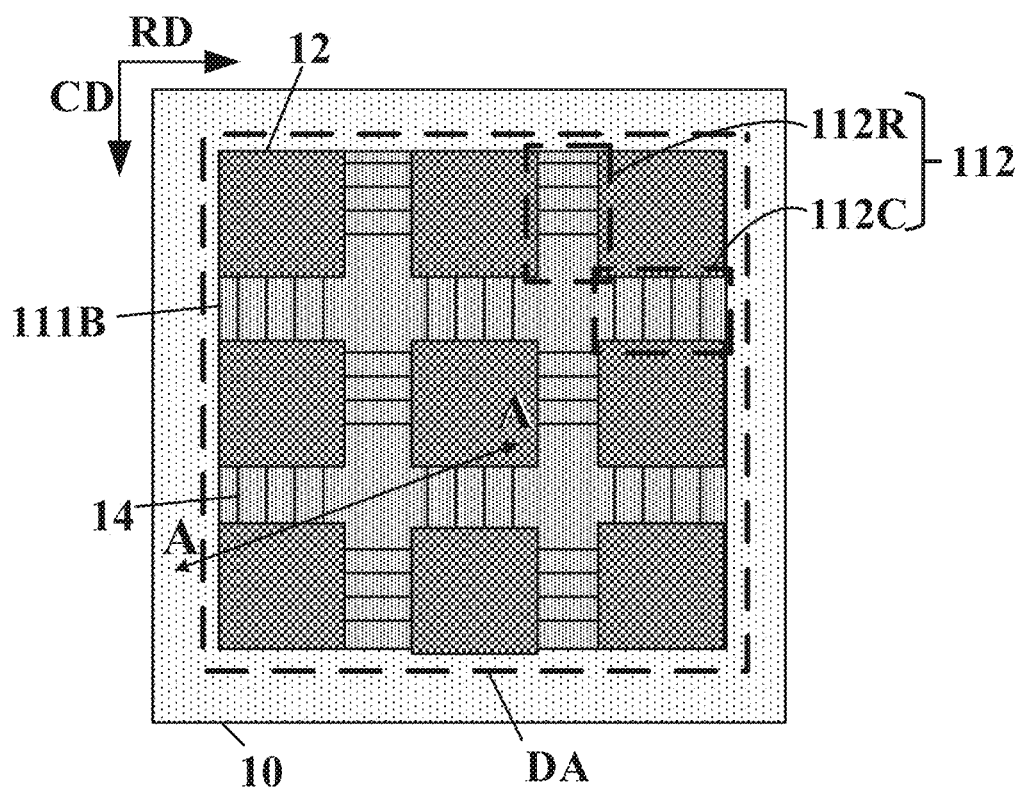
FIG. 2 is a plan view illustrating a structure of a stretchable display panel in some embodiments according to the present disclosure.
Figure 3:
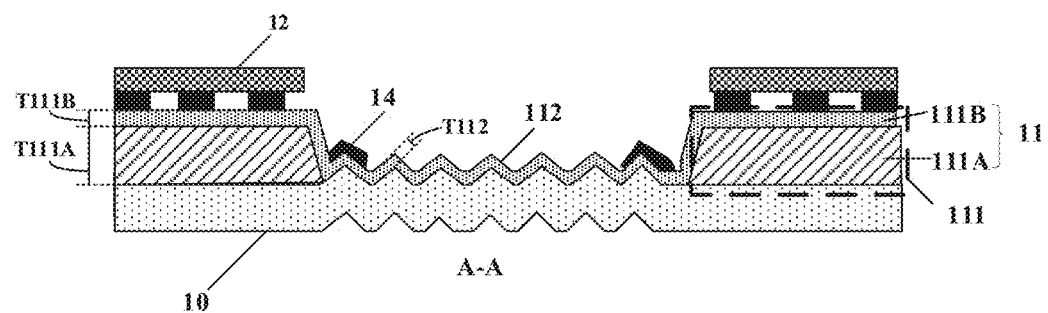
FIG. 3 is a cross-sectional view of a stretchable display panel along an A-A line in FIG. 2.

FIG. 2 is a plan view illustrating a structure of a stretchable display panel in some embodiments according to the present disclosure. FIG. 3 is a cross-sectional view of a stretchable display panel along an A-A line in FIG. 2. In some embodiments, referring to FIG. 2 and FIG. 3, the stretchable display panel includes a stretchable base substrate 10, a supporting structure 11 including a plurality of islands 111 and a plurality of bridges 112 on the stretchable base substrate 10; a plurality of display elements 12 respectively on sides of the plurality of islands 111 away from the stretchable base substrate 10; and a plurality of signal lines 14 respectively on sides of the plurality of bridges 112 away from the stretchable base substrate 10. Optionally, a respective one of the plurality of signal lines 14 connects two adjacent display elements 12. Optionally, a respective one of the plurality of signal lines 14 extends to regions including the plurality of islands 111.

Optionally, the plurality of islands 111 are arranged in a form of an array.

Optionally, the plurality of bridges 112 includes a plurality of row bridges 112R arranged in a row direction RD and a plurality of column bridges 1120 arranged in a column direction CD.

Optionally, two directly adjacent islands in a same row of islands are connected by a respective one of the plurality of row bridges 1128. Optionally, all pairs of two directly adjacent islands in a same row of islands are connected by the plurality of row bridges 112R.

Optionally, two directly adjacent islands in a same column of islands are connected by a respective one of the plurality of column bridges 1120. Optionally, all pairs of two directly adjacent islands in a same column of islands are connected by the plurality of column bridges 1120.

Optionally, two direct adjacent row bridge and column bridge are connected together. Optionally, two direction adjacent row bridges are connected together. Optionally, two direction adjacent column bridges are connected together.

Optionally, at least a portion of a respective one of the plurality of bridges 112 is buckled when substantially unstretched. Optionally, at least a portion of the stretchable base substrate 10 in a region corresponding to the respective one of the plurality of bridges 112 is buckled when substantially unstretched.

As used herein, the term "substantially unstretched" refers to stretched by no more than 10%, e.g., by no more than 7.5%, no more than 5%, no more than 2.5%, no more than 1%, no more than 0.5%, no more than 0.1%, or 0%. For example, a portion of an object is substantially unstretched when an elongation of any dimension of the portion is no more than 10%, e.g., by no more than 7.5%, no more than 5%, no more than 2.5%, no more than 1%, no more than 0.5%, no more than 0.1%, or 0%.

For example, in the process of fabricating the stretchable display panel, a force is applied on the stretchable base substrate 10 during the whole process of forming the supporting structure 11 on the stretchable base substrate 10, subsequent to forming the supporting structure 11, the force applied on the stretchable base substrate 10 is removed, so that due to the elasticity of the stretchable base substrate 10, at least a portion of the stretchable base substrate 10 is buckled due to the release of the force. Optionally, the supporting structure 11 is attached to the stretchable base substrate 10 using adhesive glue.

Optionally, regions of the stretchable display panel corresponding to the plurality of islands 111 have a Young's Modulus greater than a Young's Modulus of regions of the stretchable display panel corresponding to the plurality of bridges 112.

In some embodiments, the plurality of display elements respectively includes a plurality of light emitting elements, and a plurality of thin film transistors respectively connected to the plurality of light emitting elements. Optionally, the plurality of light emitting elements are a plurality of organic light emitting diodes. Optionally, the plurality of display elements further includes a plurality of storage capacitors. Optionally, the plurality of storage capacitors and the plurality of thin film transistors together form a pixel driving circuit.

In some embodiments, the plurality of signal lines 14 include, but are not limited to, a plurality of data lines, a plurality of gate lines, and a plurality of high voltage signal lines. For example, a respective one of the plurality of gate lines corresponds to a respective one row of the plurality rows of display elements. A respective one of the plurality of data lines corresponds a respective one column of the plurality of columns of display elements. The plurality of gate lines respectively provide scanning signals to the plurality of rows of display elements. The plurality of data lines respectively provide data signals to the plurality of columns of display elements. Light voltage signal ends of the display elements in a same row are connected to a same high voltage signal lines of the plurality of high voltage signal lines.

In some embodiments, the stretchable base substrate 10 is a stretchable, flexible, and elastic base substrate. Various appropriate materials may be used for making the stretchable base substrate. Examples of materials suitable for making the stretchable base substrate include, but are not limited to, silicone rubber, silicone elastomer, polyurethane, acrylic elastomer, and natural rubber.

In some embodiments, the plurality of islands 111 have a Young's Modulus greater than a Young's Modulus of the plurality of bridges 112, so, portions of the stretchable base substrate 10 in regions corresponding to the plurality of bridges 112 is buckled when substantially unstretched. The buckled portions of the stretchable base substrate allow a display panel having the buckled portions of the stretchable base substrate to be stretchable, and it is unnecessary to form a plurality of large-size vias to enhance the stretchability of the stretchable display panel. Without a plurality of large-size vias, the resolution of the stretchable display panel can be improved. Moreover, the plurality of islands 111 having a relatively higher Young's Modulus can limit the deformation of the stretchable display substrate, which allows wrinkles (e.g., a plurality of ridges and a plurality of valleys) to be evenly distributed in the portions of the stretchable base substrate in regions corresponding to the plurality of bridges. Subsequently, when the stretchable display panel is stretched, subpixels in the stretched portion of the stretchable display panel can be evenly distributed, and the display quality of the stretchable display panel can be improved.

Figure 4:
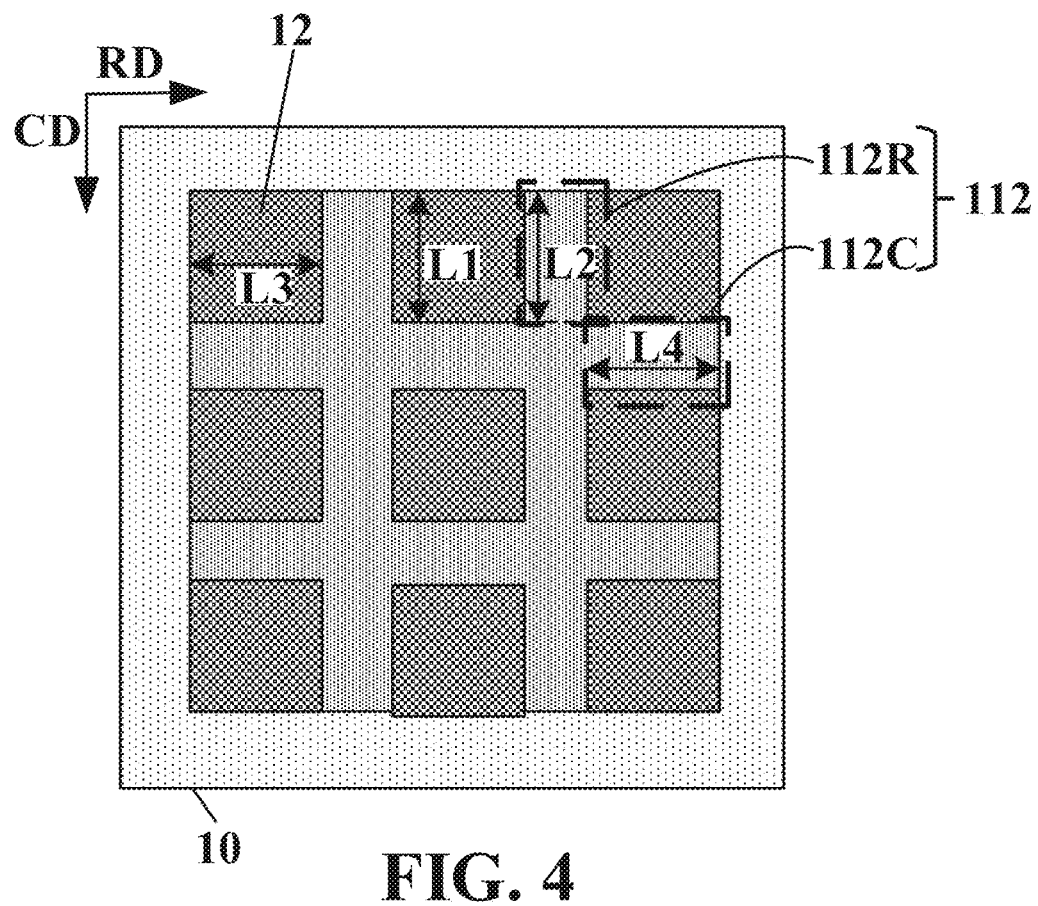
FIG. 4 is a plan view illustrating a structure of a stretchable display panel in some embodiments according to the present disclosure.

FIG. 4 is a plan view illustrating a structure of a stretchable display panel in some embodiments according to the present disclosure. In some embodiments, referring to FIG. 3 and FIG. 4, the plurality of islands 111 include a plurality of first supports 111A on the stretchable base substrate 10, and a plurality of second supports 111B respectively on sides of the plurality of first supports 111A away from the stretchable base substrate 10.

Optionally, thicknesses T111A of the plurality of first supports 111A are equal to or greater than thicknesses T111B of the plurality of second supports 111B.

Optionally, the plurality of second supports 111B and the plurality of bridges 112 forms a unitary structure. Optionally, the thicknesses T111B of the plurality of second supports 111B and thicknesses T112 of the plurality of bridges 112 are substantially the same.

As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Optionally, the plurality of second supports 111B and the plurality of bridges 112 are in a same layer and include a same material, which can simplify the process of fabricating the stretchable display panel.

As used herein, the term "same layer" refers to the relationship between the layers simultaneously formed in the same step. In one example, the plurality of second supports and the plurality of bridges are in a same layer when they are formed as a result of one or more steps of a same patterning process performed in a material deposited in a same deposition process. In another example, the plurality of second supports and the plurality of bridges can be formed in a same layer by simultaneously performing the step of forming the plurality of second supports and the step of forming the plurality of bridges. The term "same layer" does not always mean that the thickness of the layer or the height of the layer in a cross-sectional view is the same.

Optionally, the thicknesses of the plurality of bridges 112 are in a range of 800 Å to 1200 Å, e.g., 800 Å to 900 Å, 900 Å to 1000 Å, 1000 Å to 1100 Å, and 1100 Å to 1200 Å.

Optionally, a range of the thicknesses of the plurality of the first supports 111A is two to ten times of the range of the thicknesses of the plurality of bridges 112. For example, the thicknesses of the plurality of the first supports 111A are in a range of 1600 Å to 12000 Å, e.g., 1600 Å to 2000 Å, 2000 Å to 4000 Å, 4000 Å to 6000 Å, 6000 Å to 8000 Å, 8000 Å to 10000 Å, and 10000 Å to 12000 Å.

Differences between the thicknesses of the plurality of bridges 112 and the thicknesses of the plurality of the first supports 1114 allow the plurality of bridges 112 to have a relatively lower Young's Modulus, and the plurality of the islands 111 to have a relatively higher Young's Modulus, so it is easy for the portions of stretchable base substrate 10 to be buckled in regions corresponding to the plurality of bridges 112, and prevent buckles from forming on the portion of stretchable base substrate 10 in regions corresponding to the plurality of islands 111.

Optionally, referring to FIG. 2 and FIG. 3, the plurality of second supports 111B and the plurality of bridges 1112 together form a continuous layer extending throughout an entirety of a display area DA of the stretchable display panel.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

In some embodiments, the stretchable display panel further includes an encapsulating layer. Optionally, the encapsulating layer is a continuous layer extending throughout the entirety of the display area DA to encapsulate the plurality of display elements, and is it unnecessary to form the encapsulating area on the surface of the respective one of the plurality of islands and abutting the edge of the respective one of the plurality of islands, to allow the encapsulating layer to encapsulate the plurality of display elements.

In some embodiments, the plurality of first supports 111A includes an organic insulating material; and the plurality of second supports and the plurality of bridges include an inorganic insulating material. Examples of materials suitable for making the plurality of first supports include, but are not limited to, polyimide (PI), polyethylene terephthalate (PET), polymethyl methacrylate (PMMA). Examples of materials suitable for making the plurality of second supports and the plurality of bridges include, but are not limited to, silicon nitride and silicon oxide. For example, the plurality of second supports and the plurality of bridges are made of silicon nitride, silicon oxide, or a combination of silicon nitride and silicon oxide.

Figure 5:
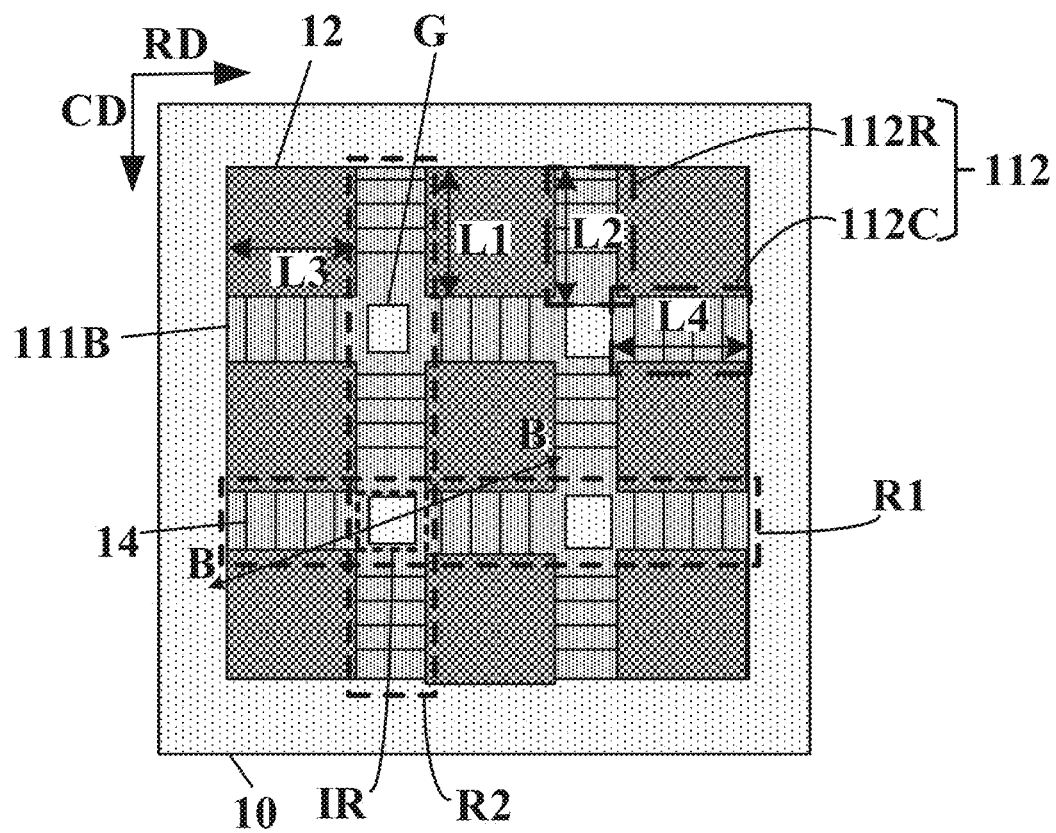
FIG. 5 is a plan view illustrating a structure of a stretchable display panel in some embodiments according to the present disclosure.
Figure 6:
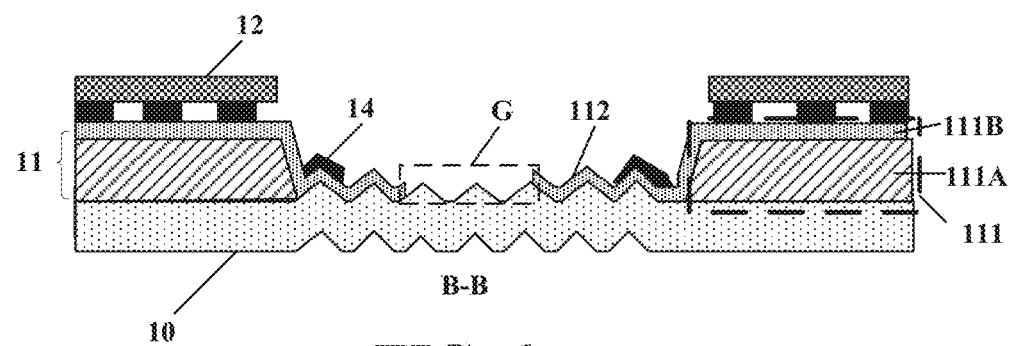
FIG. 6 is a cross-sectional view of a stretchable display panel along a B-B line in FIG. 5.

FIG. 5 is a plan view illustrating a structure of a stretchable display panel in some embodiments according to the present disclosure. FIG. 6 is a cross-sectional view of a stretchable display panel along a B-B line in FIG. 5. In some embodiments, referring to FIG. 5 and FIG. 6, the stretchable display panel has a plurality of first regions R1, and a plurality of second regions R2. Optionally, a respective one of the plurality of first regions R1 is between two adjacent rows of a plurality of rows of islands. Optionally, a respective one of the plurality of second regions R2 between two adjacent columns of a plurality of columns of islands. Optionally, the plurality of first regions R1 and the plurality of second regions R2 intersect with each other to form a plurality of intersection regions IR.

Optionally, the stretchable display panel has a plurality of gap regions G in which the supporting structure 11 is at least partially absent, and a respective one of the plurality of gap regions G at least partially in the respective one of the plurality of intersection regions. Optionally, the stretchable base substrate 10 is partially absent in the plurality of gap regions G. Optionally, the plurality of signal lines 14 are absent from the plurality of gap regions G.

Optionally, the respective one of the plurality of gap regions G is limited in the respective one of the plurality of intersection regions IR.

Optionally, the respective one of the plurality of gap regions G abuts two adjacent row bridges of the plurality of row bridges 112R, and abuts two adjacent column bridges of the plurality of column bridges 112C.

Optionally, the respective one of the plurality of gap regions G is spaced apart from adjacent islands of the plurality of islands 111 by the two adjacent row bridges and the two adjacent column bridges. Optionally, an entirety of a periphery of a respective one of the plurality of islands 111 is surrounded by adjacent bridges of the plurality of bridges 112.

Optionally, a plurality of columns of islands and a plurality of columns of column bridges are alternatively arranged. Optionally, a plurality of rows of islands and a plurality of rows of row bridges are alternatively arranged.

In some embodiments, referring to FIG. 4 and FIG. 5, the respective one of the plurality of row bridges 112R between the two directly adjacent islands in the same row of islands has a length L2 along the column direction CD equal to or greater than a length L1 along the column direction CD of each of the two directly adjacent islands in the same row of islands.

Optionally, the respective one of the plurality of column bridges 112C between the two directly adjacent islands in the same column of islands has a width L4 along the row direction RD equal to or greater than a width L3 along the row direction RD of each of the two directly adjacent islands in the same column of islands.

In some embodiments, the regions of the stretchable display panel corresponding to the plurality of bridges 112 have the Young's Modulus greater than a Young's Modulus of regions of the stretchable display panel corresponding to the plurality of gap regions G.

FIG. 7 is a schematic diagram illustrating budded portions of a stretchable base substrate in some embodiments according to the present disclosure. In some embodiments, referring to FIG. 7, a plurality of rigid structures 20 are disposed on a stretchable base substrate 10. When a force stretching the stretchable base substrate 10 is removed, portions of the stretchable base substrate 10 in regions between two adjacent rigid structures of the plurality of rigid structures 20 are buckled. Arcs in FIG. 7 represent ridges in the buckled portion of the stretchable base substrate 10, intervals between arcs represent valleys in the budded portion of the stretchable base substrate 10.

In another aspect, the present disclosure also provides a method of fabricating a stretchable display panel. FIG. 8 is a flow chart illustrating a method of fabricating a stretchable display panel in some embodiments according to the present disclosure. In some embodiments, referring to FIG. 8, the method of fabricating the stretchable display panel includes forming a supporting structure including a plurality of islands and a plurality of bridges on a support substrate; forming a plurality of display elements respectively on sides of the plurality of islands away from the support substrate; forming a plurality of signal lines respectively on sides of the plurality of bridges away from the support substrate, a respective one of the plurality of signal lines connecting two adjacent display elements; removing the support substrate from the supporting structure; applying a force on a stretchable base substrate to stretch the stretchable base substrate; disposing the supporting structure on the stretchable base substrate having the force applied thereon; and removing the force applied on the stretchable base substrate to form at least a portion of the stretchable base substrate in a region corresponding to a respective one of the plurality of bridges which is buckled when substantially unstretched.

Optionally, forming the supporting structure including forming the plurality of islands arranged in a form of an array. Optionally, the plurality of bridges are formed to include a plurality of row bridges arranged along a row direction; and a plurality of column bridges arranged along a column direction. In some example, two directly adjacent islands in a same row of islands are connected by a respective one of the plurality of row bridges, and two directly adjacent islands in a same column of islands are connected by a respective one of the plurality of column bridges. In another example, any two direction adjacent islands are connected by a respective one of the plurality of bridges.

Optionally, the support substrate is a rigid substrate made of materials include, but are not limited to, glass.

FIG. 9 is a flow chart illustrating a method of forming a supporting structure in some embodiments according to the present disclosure. In some embodiments, referring to FIG. 9, forming the supporting structure includes forming a plurality of first supports on the support substrate; and forming a plurality of second supports respectively on sides of the plurality of first supports away from the support substrate. Optionally, forming the plurality of first supports includes forming a first support material layer on the support substrate; and patterning the first support material layer to form a plurality of first supports on the support substrate. Optionally, forming the plurality of second supports includes forming a second support material layer on sides of the plurality of first supports away from the support substrate. Optionally, a respective one of the plurality of islands are formed by forming the respective one of the plurality of first supports, and forming the respective one of the plurality of second supports.

Optionally, the second support material layer is formed to extend throughout an entirety of the support substrate. Optionally, the plurality of second supports are portions of the second support material layer in regions corresponding to the plurality of first supports. Optionally, a portion of the second support material layer in regions between two directly adjacent islands in a same row of islands forms a respective one of the plurality of row bridges. Optionally, a portion of the second support material layer in regions between two directly adjacent islands in a same column of islands forms a respective one of the plurality of column bridges.

In some embodiments, the plurality of first supports have a pattern that defines a plurality of first regions and a plurality of second regions. Optionally, a respective one of the plurality of first regions is between two adjacent rows of a plurality of rows of first supports. Optionally, a respective one of the plurality of second regions is between two adjacent columns of a plurality of columns of first supports. Optionally, the plurality of first regions and the plurality of second regions intersect with each other to form a plurality of intersection regions.

Optionally, forming the supporting structure further includes etching the second support material layer in a plurality of gap regions, in which the second support material layer is at least partially absent. Optionally, a respective one of the plurality of gap regions is at least partially in the respective one of the plurality of intersection regions. Optionally, the respective one of the plurality of gap regions is limited in the respective one of the plurality of intersection regions.

Optionally, the stretchable base substrate is partially absent in the plurality of gap regions. Optionally, the plurality of signal lines are absent from the plurality of gap regions.

In some embodiments, the plurality of first supports are formed using an organic insulating material; and the plurality of second supports and the plurality of bridges are formed using an inorganic insulating material.

In some embodiments, regions of the stretchable display panel corresponding to the plurality of islands have a Young's Modulus greater than a Young's Modulus of regions of the stretchable display panel corresponding to the plurality of bridges. Regions of the stretchable display panel corresponding to the plurality of bridges have the Young's Modulus greater than a Young's Modulus of regions of the stretchable display panel corresponding to the plurality of gap regions.

In some embodiments, the respective one of the plurality of row bridges between the two directly adjacent islands in the same row of islands is formed to have a length along the column direction equal to or greater than a length along the column direction of each of the two directly adjacent islands in the same row of islands.

In some embodiments, the respective one of the plurality of column bridges between the two directly adjacent islands in the same column of islands is formed to have a width along the row direction equal to or greater than a width along the row direction of each of the two directly adjacent islands in the same column of islands.

In some embodiments, the plurality of first supports are formed to have thicknesses greater than thicknesses of the plurality of second supports. Optionally, the plurality of second supports and thicknesses of the plurality of bridges are formed to have a same thickness.

In some embodiments, the respective one of the plurality of gap regions is formed to abut two adjacent row bridges of the plurality of row bridges, and to abut two adjacent column bridges of the plurality of column bridges.

In some embodiments, the respective one of the plurality of gap regions is formed to be spaced apart from adjacent islands of the plurality of islands by the two adjacent row bridges and the two adjacent column bridges. Optionally, an entirety of a periphery of a respective one of the plurality of islands is formed to be surrounded by adjacent bridges of the plurality of bridges.

In some embodiments, a plurality of columns of islands and a plurality of columns of column bridges are formed to be alternatively arranged; and a plurality of rows of islands and a plurality of rows of row bridges are formed to be alternatively arranged.

In some embodiments, the plurality of display elements are formed to respectively include a plurality of organic light emitting diodes; and a plurality of thin film transistors are formed to be respectively connected to the plurality of organic light emitting diodes.

FIG. 10A to FIG. 10G are schematic diagrams illustrating a process of fabricating a stretchable display panel in some embodiments according to the present disclosure. In some embodiments, referring to FIG. 10A and FIG. 10B, the method of fabricating a stretchable display panel includes forming a first supporting material layer 1110 on the support substrate 30; and patterning the first support materials to form a plurality of first support 111A on the support substrate 30.

Optionally, the plurality of first support 111A are formed using one or more materials including, but not limited to, polyimide (PI), polyethylene terephthalate (PET), polymethyl methacrylate (PMMA).

In some embodiments, referring to FIG. 10C and FIG. 4, the method of fabricating the stretchable display panel includes forming a second support material layer 1120 on sides of the plurality of first supports 111A away from the support substrate 30.

Optionally, the plurality of second supports 111B are formed respectively on sides of the plurality of first supports 111A away from the support substrate 30. Optionally, a respective one of the plurality of islands 111 are formed by forming the respective one of the plurality of first supports 111A, and forming the respective one of the plurality of second supports 111B.

Optionally, the second support material layer 1120 is formed to extend throughout an entirety of the support substrate 30. Optionally, portions of the second support material layer 1120 in regions corresponding to the plurality of first supports 111A form the plurality of second supports 111B. Optionally, a portion of the second support material layer 1120 in regions between two directly adjacent islands forms a respective one of the plurality of bridges 112.

Optionally, the second support material layer 1120 is formed using one or a combination of silicon carbide and silicon oxide.

Optionally, a thickness of the first support material layer 1110 is greater than a thickness of the second support material layer 1120. So, the thickness of the plurality of first supports 111A are greater than the thicknesses of the plurality of bridges 112.

Optionally, the thicknesses of the plurality of bridges 112 are in a range of 800 Å to 1200 Å, e.g., 800 Å to 900 Å, 900 Å to 1000 Å to 1100 Å, and 1100 Å to 1200 Å. Optionally, a range of the thicknesses of the plurality of the first supports 111A is two to ten times of the range of the thicknesses of the plurality of bridges 112, For example, the thicknesses of the plurality of the first supports 111A are in a range of 1600 Å to 12000 Å, e.g., 1600 Å to 2000 Å, 2000 Å to 4000 Å, 4000 Å to 6000 Å, 6000 Å to 8000 Å, 8000 Å to 10000 Å, and 10000 Å to 12000 Å.

Differences between the thicknesses of the plurality of bridges 112 and the thicknesses of the plurality of the first supports 111A allow the plurality of bridges 112 has a relatively lower Young's Modulus, and allow the plurality of the islands 111 has a relatively higher Young's Modulus, so it is easy for the portions of stretchable base substrate 10 to be buckled in regions corresponding to the plurality of bridges 112, and prevent buckling from forming on the portion of stretchable base substrate 10 in regions corresponding to the plurality of islands 111.

Figure 10D:
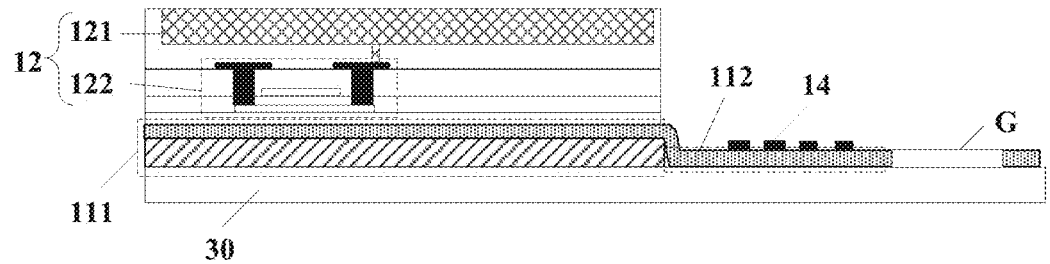

In some embodiments, referring to FIG. 10D and FIG. 5, the plurality of first supports 111A have a pattern that defines a plurality of first regions R1 and a plurality of second regions R2. A respective one of the plurality of first regions R1 is between two adjacent rows of a plurality of rows of first supports. A respective one of the plurality of second regions R2 is between two adjacent columns of a plurality of columns of first supports. The plurality of first regions R1 and the plurality of second regions R2 intersect with each other to form a plurality of intersection regions IR.

Optionally, forming the supporting structure further includes etching the second support material layer 1120 in a plurality of gap regions G, in which the second support material layer is at least partially absent. Optionally, a respective one of the plurality of gap regions G is at least partially in the respective one of the plurality of intersection regions IR.

In some embodiments, the method of fabricating the stretchable display panel further includes forming a plurality of display elements 12 respectively on sides of the plurality of islands 111 away from the support substrate 30; and forming a plurality of signal lines 14 respectively on sides of the plurality of bridges 112 away from the support substrate 30. Optionally, a respective one of the plurality of signal lines are formed to connect two adjacent display elements.

Optionally, the plurality of gap regions G is absent of any of the plurality of signal lines 14.

Optionally, forming the plurality of display elements 12 includes forming a plurality of organic light emitting elements 121 and a plurality of thin film transistors 122 respectively connected to the plurality of organic light emitting elements 121.

Optionally, the plurality of signal lines 14 include, but are not limited to, a plurality of data lines, a plurality of gate lines, a plurality of high voltage signal lines. For example, one of the plurality of gate lines and a gate electrode of one of the plurality of thin film transistors are formed from a same material deposited in a same deposition process. One of the plurality of signal lines and a source electrode and drain electrode of the one of the plurality of thin film transistors are formed from a same material deposited in a same deposition process.

Optionally, the plurality of gap regions G can be formed prior to forming the plurality of display elements 12. Optionally, the plurality of gap regions G can be formed subsequent to forming the plurality of display elements 12.

Figure 10E:
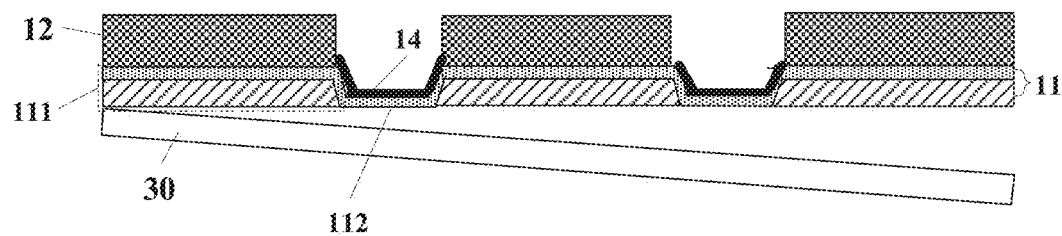

In some embodiments, referring to FIG. 10E, the method of fabricating the stretchable display panel includes removing the support substrate 30 from the supporting structure 11.

Figure 10F:
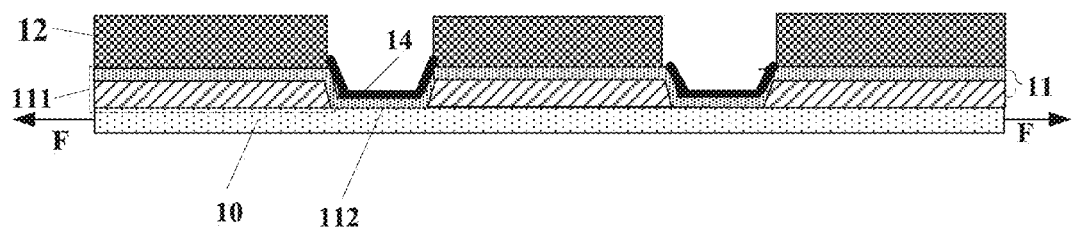

In some embodiments, referring to FIG. 10F, the method of fabricating the stretchable display panel includes applying a force F on a stretchable base substrate 10 to stretch the stretchable base substrate 10; and disposing the supporting structure 11 on the stretchable base substrate 10 having the force applied thereon.

Optionally, the stretchable base substrate 10 are stretched by forces applied on corners of the stretchable base substrate 10 in a direction away from a center of the stretchable base substrate 10.

Figure 10G:
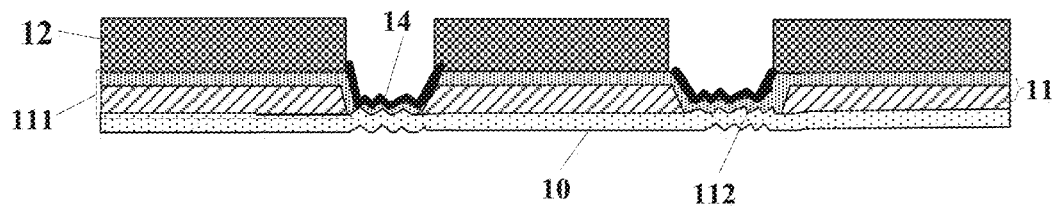

In some embodiments, referring to FIG. 10G, the method of fabricating the stretchable display panel includes removing the force F applied on the stretchable base substrate 10 to form at least a portion of the stretchable base substrate 10 in regions corresponding to the plurality of bridges 112 buckled when substantially unstretched.

In another aspect, the present disclosure also provides a display apparatus. In some embodiments, the display apparatus includes the stretchable display panel described herein, and one or more integrated circuits connected to the stretchable display panel.

Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stretchable display panel, comprising:
    a stretchable base substrate;
    a supporting structure comprising a plurality of islands and a plurality of bridges on the stretchable base substrate;
    a plurality of display elements respectively on sides of the plurality of islands away from the stretchable base substrate; and
    a plurality of signal lines respectively on sides of the plurality of bridges away from the stretchable base substrate, a respective one of the plurality of signal lines connecting two adjacent display elements;
    wherein the plurality of islands are arranged in a form of an array;
    the plurality of bridges comprise a plurality of row bridges arranged in a row direction and a plurality of column bridges arranged in a column direction;
    two directly adjacent islands in a same row of islands are connected by a respective one of the plurality of row bridges;
    two directly adjacent islands in a same column of islands are connected by a respective one of the plurality of column bridges;
    at least a portion of a respective one of the plurality of bridges is buckled when substantially unstretched;
    at least a portion of the stretchable base substrate in a region corresponding to the respective one of the plurality of bridges is buckled when substantially unstretched;
    the plurality of islands comprise a plurality of first supports on the stretchable base substrate, and a plurality of second supports respectively on sides of the plurality of first supports away from the stretchable base substrate;
    thicknesses of the plurality of first supports are greater than thicknesses of the plurality of second supports;
    the plurality of second supports and the plurality of bridges forms a unitary structure; and
    the thicknesses of the plurality of second supports and thicknesses of the plurality of bridges are substantially the same.

2. The stretchable display panel of claim 1, wherein the respective one of the plurality of row bridges between the two directly adjacent islands in the same row of islands has a length along the column direction equal to or greater than a length along the column direction of each of the two directly adjacent islands in the same row of islands.

3. The stretchable display panel of claim 2, wherein the respective one of the plurality of column bridges between the two directly adjacent islands in the same column of islands has a width along the row direction equal to or greater than a width along the row direction of each of the two directly adjacent islands in the same column of islands.

4. The stretchable display panel of claim 1, wherein the plurality of second supports and the plurality of bridges together form a continuous layer extending throughout an entirety of a display area of the stretchable display panel.

5. The stretchable display panel of claim 1, wherein the stretchable display panel has:
    a plurality of first regions, a respective one of the plurality of first regions between two adjacent rows of a plurality of rows of islands;
    a plurality of second regions, a respective one of the plurality of second regions between two adjacent columns of a plurality of columns of islands, the plurality of first regions and the plurality of second regions intersecting with each other forming a plurality of intersection regions; and
    a plurality of gap regions in which the supporting structure is at least partially absent, a respective one of the plurality of gap regions at least partially in the respective one of the plurality of intersection regions.

6. The stretchable display panel of claim 5, wherein the respective one of the plurality of gap regions is limited in the respective one of the plurality of intersection regions.

7. The stretchable display panel of claim 5, wherein the respective one of the plurality of gap regions abuts two adjacent row bridges of the plurality of row bridges, and abuts two adjacent column bridges of the plurality of column bridges.

8. The stretchable display panel of claim 7, wherein the respective one of the plurality of gap regions is spaced apart from adjacent islands of the plurality of islands by the two adjacent row bridges and the two adjacent column bridges; and
    an entirety of a periphery of a respective one of the plurality of islands is surrounded by adjacent bridges of the plurality of bridges.

9. The stretchable display panel of claim 1, wherein a plurality of columns of islands and a plurality of columns of column bridges are alternatively arranged; and
    a plurality of rows of islands and a plurality of rows of row bridges are alternatively arranged.

10. The stretchable display panel of claim 1, wherein the plurality of first supports comprise an organic insulating material; and
    the plurality of second supports and the plurality of bridges comprise an inorganic insulating material.

11. The stretchable display panel of claim 1, wherein the plurality of display elements respectively comprises a plurality of organic light emitting diodes; and a plurality of thin film transistors respectively connected to the plurality of organic light emitting diodes.

12. A method of fabricating a stretchable display panel, comprising:
    forming a supporting structure comprising a plurality of islands and a plurality of bridges on a support substrate;
    forming a plurality of display elements respectively on sides of the plurality of islands away from the support substrate;
    forming a plurality of signal lines respectively on sides of the plurality of bridges away from the support substrate, a respective one of the plurality of signal lines connecting two adjacent display elements;

removing the support substrate from the supporting structure;

applying a force on a stretchable base substrate to stretch the stretchable base substrate;

disposing the supporting structure on the stretchable base substrate having the force applied thereon; and removing the force applied on the stretchable base substrate to form at least a portion of the stretchable base substrate in a region corresponding to a respective one of the plurality of bridges which is buckled when substantially unstretched;

wherein the plurality of islands are arranged in a form of an array;

the plurality of bridges are formed to comprises a plurality of row bridges arranged along a row direction; and a plurality of column bridges arranged along a column direction;

two directly adjacent islands in a same row of islands are connected by a respective one of the plurality of row bridges; and two directly adjacent islands in a same column of islands are connected by a respective one of the plurality of column bridges.

13. The method of claim 12, wherein forming the supporting structure on a support substrate comprises:

forming a plurality of first supports on the support substrate; and forming a plurality of second supports respectively on sides of the plurality of first supports away from the support substrate;

wherein forming the plurality of first supports comprises:

forming a first support material layer on the support substrate; and patterning the first support material layer to form a plurality of first supports on the support substrate;

wherein forming the plurality of second supports comprises forming a second support material layer on sides of the plurality of first supports away from the support substrate;

wherein a respective one of the plurality of islands are formed by forming the respective one of the plurality of first supports, and forming the respective one of the plurality of second supports.

14. The method of claim 13, wherein the second support material layer is formed to extend throughout an entirety of the support substrate;

wherein the plurality of second supports are portions of the second support material layer in regions corresponding to the plurality of first supports;

a portion of the second support material layer in regions between two directly adjacent islands in a same row of islands forms a respective one of the plurality of row bridges; and a portion of the second support material layer in regions between two directly adjacent islands in a same column of islands forms a respective one of the plurality of column bridges.

15. The method of claim 14, wherein the plurality of first supports have a pattern that defines a plurality of first regions and a plurality of second regions;

a respective one of the plurality of first regions is between two adjacent rows of a plurality of rows of first supports;

a respective one of the plurality of second regions is between two adjacent columns of a plurality of columns of first supports;

the plurality of first regions and the plurality of second regions intersect with each other to form a plurality of intersection regions;

wherein forming the supporting structure further comprises etching the second support material layer in a plurality of gap regions, in which the second support material layer is at least partially absent; and a respective one of the plurality of gap regions is at least partially in the respective one of the plurality of intersection regions.

16. The method of claim 13, wherein the plurality of first supports are formed using an organic insulating material; and the plurality of second supports and the plurality of bridges are formed using an inorganic insulating material.

17. The method of claim 12, wherein forming the plurality of display elements comprises forming a plurality of organic light emitting diodes respectively in regions corresponding to the plurality of display elements; and forming a plurality of thin film transistors respectively connected to the plurality of organic light emitting diodes.

18. A display apparatus, comprising:

the stretchable display panel of claim 1; and one or more integrated circuits connected to the stretchable display panel.

* * * * *